United States Patent
Yamada et al.

(10) Patent No.: US 11,943,977 B2
(45) Date of Patent: Mar. 26, 2024

(54) DISPLAY DEVICE

(71) Applicant: SHARP KABUSHIKI KAISHA, Sakai (JP)

(72) Inventors: Junichi Yamada, Sakai (JP); Makoto Yokoyama, Sakai (JP); Yasushi Kubota, Sakai (JP)

(73) Assignee: SHARP KABUSHIKI KAISHA, Osaka (JP)

(*) Notice: Subject to any disclaimer, the term of this patent is extended or adjusted under 35 U.S.C. 154(b) by 482 days.

(21) Appl. No.: 17/278,927

(22) PCT Filed: Sep. 27, 2018

(86) PCT No.: PCT/JP2018/035953
§ 371 (c)(1),
(2) Date: Mar. 23, 2021

(87) PCT Pub. No.: WO2020/065823
PCT Pub. Date: Apr. 2, 2020

(65) Prior Publication Data
US 2022/0052145 A1 Feb. 17, 2022

(51) Int. Cl.
| H01L 27/32 | (2006.01) |
| H10K 59/121 | (2023.01) |
| H10K 59/131 | (2023.01) |

(52) U.S. Cl.
CPC ......... *H10K 59/131* (2023.02); *H10K 59/121* (2023.02)

(58) Field of Classification Search
CPC .. H10K 59/131; H10K 59/121; G09G 3/3233; G09G 2300/0426; G09F 9/30
See application file for complete search history.

(56) References Cited

U.S. PATENT DOCUMENTS

| 2012/0112988 | A1 | 5/2012 | Nakanishi et al. |
| 2014/0034923 | A1 | 2/2014 | Kim et al. |
| 2015/0219944 | A1 | 8/2015 | Mitsumoto et al. |
| 2016/0358995 | A1 | 12/2016 | Kim et al. |
| 2017/0256601 | A1 | 9/2017 | Kim et al. |
| 2018/0175134 | A1 | 6/2018 | Kim et al. |
| 2019/0131360 | A1* | 5/2019 | Lee ................. H10K 59/88 |
| 2019/0157376 | A1 | 5/2019 | Kim et al. |
| 2019/0172890 | A1* | 6/2019 | Cho ............... H10K 59/8722 |
| 2019/0331974 | A1 | 10/2019 | Furuta et al. |
| 2020/0052061 | A1 | 2/2020 | Kim et al. |
| 2020/0365678 | A1 | 11/2020 | Kim et al. |

FOREIGN PATENT DOCUMENTS

| JP | 2012-103335 A | 5/2012 |
| JP | 2014-032379 A | 2/2014 |
| WO | 2014/024783 A1 | 2/2014 |
| WO | 2018/030207 A1 | 2/2018 |

\* cited by examiner

*Primary Examiner* — Mohammed R Alam
(74) *Attorney, Agent, or Firm* — ScienBiziP, P.C.

(57) ABSTRACT

A display device includes: a display region formed with a notch portion; and a frame region surrounding the display region, wherein the display region includes a first lead wiring line and a second lead wiring line. In a plan view, an extending direction of the first lead wiring line and an extending direction of the second lead wiring line are same. Either one lead wiring line of the first lead wiring line and the second lead wiring line includes a first region a second region.

20 Claims, 8 Drawing Sheets

DISPLAY DEVICE

TECHNICAL FIELD

The disclosure relates to a display device.

BACKGROUND ART

PTL 1 discloses a technique of suppressing luminance unevenness of a display region having an irregular shape (a shape including a corner notch).

CITATION LIST

Patent Literature

PTL 1: JP 2012-103335 A (published on May 31, 2012)

SUMMARY

Technical Problem

In a panel having a camera notch, there is a problem in that luminance variation is generated when bus line loads are non-uniform in a main display portion and a notch display portion.

An aspect of the disclosure has been made in view of the above-mentioned issue, and has an object to provide a display device in which luminance variation is suppressed by decreasing a difference in the bus line loads in a main display portion and a notch display portion.

Solution to Problem

A display device according to an aspect of the disclosure includes:
a display region formed with a notch portion; and
a frame region surrounding the display region,
wherein the display region includes
a plurality of data signal lines,
a plurality of control lines including a plurality of scanning control lines intersecting the plurality of data signal lines and a plurality of light emission control lines intersecting the plurality of data signal lines, and
a plurality of subpixel circuits corresponding to respective intersection points of the plurality of data signal lines and the plurality of scanning control lines,
a frame region on a periphery of the notch portion out of the frame region includes
a first lead wiring line electrically connected to a first control line and extending from the display region toward the notch portion, the first control line being one of the plurality of control lines, and
a second lead wiring line electrically connected to a second control line and extending from the display region toward the notch portion, the second control line being adjacent to the first control line,
in the display region, the first control line and the second control line are formed of a first metal layer,
in the frame region on the periphery of the notch portion, the first lead wiring line is formed of the first metal layer, and the second lead wiring line is formed of a second metal layer, the second metal layer being a different layer from the first metal layer,
in a plan view, an extending direction of the first lead wiring line and an extending direction of the second lead wiring line are same, the first lead wiring line and the second lead wiring line overlap each other via an inorganic insulating film, and
either one lead wiring line of the first lead wiring line and the second lead wiring line includes
a first region overlapping to straddle only an end portion of another lead wiring line of the first lead wiring line and the second lead wiring line on a side opposite to the display region in a direction orthogonal to the extending direction of the other lead wiring line and
a second region overlapping to straddle only an end portion of the other lead wiring line on a side closer to the display region in the direction orthogonal to the extending direction the other lead wiring line.

Advantageous Effects of Disclosure

According to one aspect of the disclosure, luminance variation can be suppressed by reducing a difference in bus line loads in the main display portion and the notch display portion.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
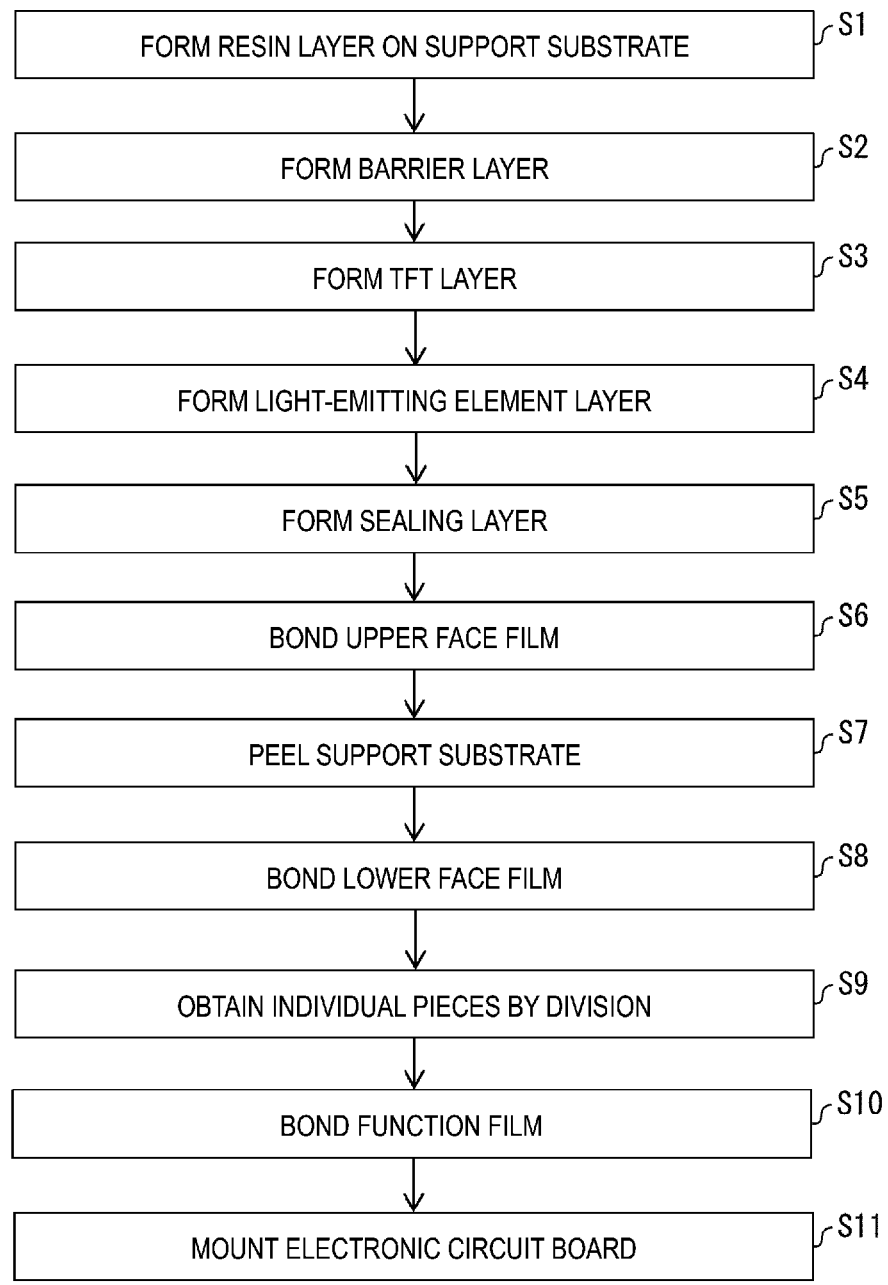
FIG. 1 is a flowchart illustrating an example of a method of manufacturing a display device.
Figure 2:
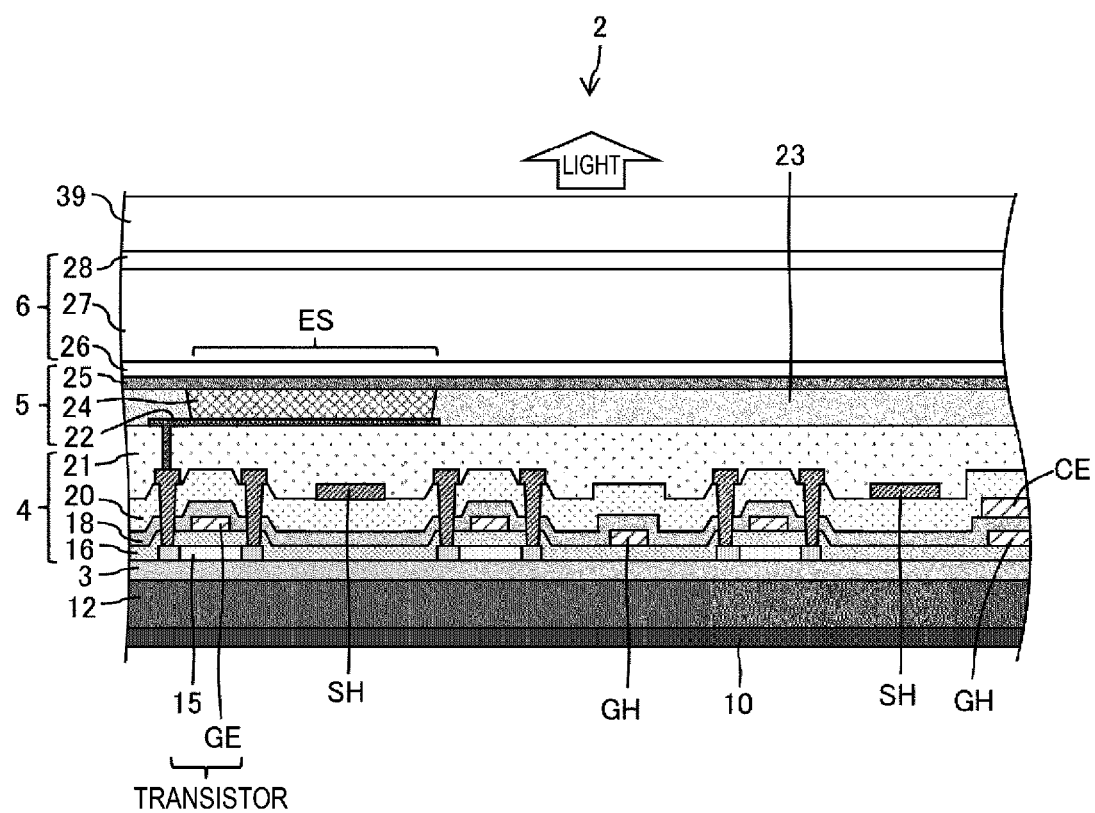
FIG. 2 is a cross-sectional view illustrating a configuration example of a display region of a display device.

FIG. 1 is a flowchart illustrating an example of a method of manufacturing a display device. FIG. 2 is a cross-sectional view illustrating a configuration example of a display portion of the display device.

In a case where a flexible display device is manufactured, as illustrated in FIG. 1 and FIG. 2, first, a resin layer 12 is formed on a transparent support substrate (a mother glass, for example) (step S1). Next, a barrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 due to irradiation with a laser light or the like (step S7). Next, a lower face film 10 is bonded to the lower face of the resin layer 12 (step S8). Next, the layered body including the lower face film 10, the resin layer 12, the barrier layer 3, the TFT layer 4, the light-emitting element layer 5, and the sealing layer 6 is divided to obtain a plurality of individual pieces (step S9). Next, a function film 39 is bonded on the obtained individual pieces (step S10). Next, an electronic circuit board (for example, an IC chip or an FPC) is mounted on a portion (terminal portion) of the display region located further outward (a non-display region or a frame) than a portion where a plurality of subpixels are formed (step S11). Note that steps S1 to S11 are executed by a display device manufacturing apparatus (including a film formation apparatus that executes the process from step S1 to S5).

Examples of the material of the resin layer 12 include a polyimide and the like.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD), for example.

The TFT layer 4 includes a semiconductor film 15, an inorganic insulating film 16 (a gate insulating film) as an upper layer overlying the semiconductor film 15, a first metal layer as an upper layer overlying the inorganic insulating film 16, an inorganic insulating film 18 as an upper layer overlying the first metal layer, a second metal layer as an upper layer overlying the inorganic insulating film 18, an inorganic insulating film 20 as an upper layer overlying the second metal layer, a third metal layer as an upper layer overlying the inorganic insulating film 20, and a flattening film 21 as an upper layer overlying the third metal layer.

The first metal layer includes a gate electrode GE, a scanning control line G, and a light emission control line EM. The second metal layer includes a capacitance electrode CE and an initialization power source line Pi. The third metal layer includes a data signal line DL and a high voltage power source line Ph.

The semiconductor film 15 is constituted of, for example, a low-temperature polysilicon (LTPS) or an oxide semiconductor (for example, an In—Ga—Zn—O based semiconductor), and a transistor (TFT) is configured to include the semiconductor film 15 and the gate electrode GE. FIG. 2 illustrates the transistor that has a top gate structure, but the transistor may have a bottom gate structure.

The gate electrode GE, the scanning control line G, the capacitance electrode CE, and the data signal line DL are each composed of a single layer film or a layered film of a metal including at least one of aluminum, tungsten, molybdenum, tantalum, chromium, titanium, and copper, for example.

Each of the inorganic insulating films 16, 18, and 20 can be formed of, for example, a silicon oxide (SiOx) film or a silicon nitride (SiNx) film, or a layered film of these, formed by using a CVD method. The flattening film 21 can be formed of, for example, a coatable organic material such as polyimide or acrylic.

The light-emitting element layer 5 includes an anode 22 in an upper layer overlying the flattening film 21, an edge cover 23 having insulating properties and covering an edge of the anode 22, an electroluminescent (EL) layer 24 in an upper layer overlying the edge cover 23, and a cathode 25 in an upper layer overlying the EL layer 24. The edge cover 23 is formed by applying an organic material such as a polyimide or an acrylic and then patterning the organic material by photolithography, for example.

On a subpixel-by-subpixel basis, a light-emitting element ES (for example, an organic light emitting diode (OLED) or a quantum dot light emitting diode (QLED)) including the island-shaped anode 22, the EL layer 24, and the cathode 25 is formed in the light-emitting element layer 5. The control circuit of the light-emitting element ES is formed in the TFT layer 4, and each subpixel is formed of the light-emitting element and a control circuit thereof (referred to as a subpixel circuit).

For example, the EL layers 24 are formed by layering a hole injection layer, a hole transport layer, a light-emitting layer, an electron transport layer, and an electron injection layer in this order, from the lower layer side. The light-emitting layer is formed into an island shape at an opening of the edge cover 23 (on a subpixel-by-subpixel basis) by vapor deposition or an ink-jet method. Other layers are formed in an island shape or a solid-like shape (common layer). A configuration is also possible in which one or more layers out of the hole injection layer, the hole transport layer, the electron transport layer, and the electron injection layer are not formed.

When the light-emitting layer of the OLED is formed by vapor deposition, a fine metal mask (FMM) is used. The FMM is a sheet with a large number of openings (for example, made of Invar material), and an island-shaped light-emitting layer (corresponding to one subpixel) is formed of an organic material passing through one of the openings.

With the light-emitting layer of the QLED, for example, an island-shaped light-emitting layer (corresponding to one subpixel) can be formed by ink-jet coating a solvent having quantum dots diffused therein.

The anode (anode electrode) 22 is formed by a layering of indium tin oxide (ITO) and silver (Ag) or an alloy containing Ag, for example, and has light reflectivity. The cathodes (cathode electrode) 25 can be constituted by a transparent conductive material such as a MgAg alloy (extremely thin film), ITO, or indium zinc oxide (IZO).

In a case where the light-emitting element ES is an OLED, positive holes and electrons recombine inside the light-emitting layer in response to a drive current between the anode 22 and the cathode 25, and light is emitted when the excitons generated in this manner transition to a ground state. Because the cathode 25 is transparent and the anode 22 has light reflectivity, the light emitted from the EL layer 24 travels upward and becomes top-emitting.

In a case where the light-emitting element ES is a QLED, positive holes and electrons recombine inside the light-emitting layer in response to a drive current between the anode 22 and the cathode 25, and light (fluorescence) is emitted when the excitons generated in this manner transition from the conduction band of the quantum dot to the valence band.

A light-emitting element (such as an inorganic light emitting diode) other than an OLED or QLED may be formed in the light-emitting element layer 5.

The sealing layer 6 is transparent, and includes an inorganic sealing film 26 for covering the cathode 25, an organic buffer film 27 formed as an upper layer overlying the inorganic sealing film 26, and an inorganic sealing film 28 formed as an upper layer overlying the organic buffer film 27. The sealing layer 6 covering the light-emitting element layer 5 inhibits foreign matter such as water and oxygen from penetrating the light-emitting element layer 5.

Each of the inorganic sealing film 26 and the inorganic sealing film 28 is an inorganic insulating film and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as an acrylic. The organic buffer film 27 can be formed, for example, by ink-jet application, and a bank for stopping droplets may be provided in the non-display region.

The lower face film 10 is, for example, a PET film bonded in a lower face of the resin layer 12 after the support substrate is peeled, to realize a display device having excellent flexibility. The function film 39 has at least one of an optical compensation function, a touch sensor function, and a protection function, for example.

The flexible display device has been described above, but when a non-flexible display device is to be manufactured, ordinarily, the formation of a resin layer, the replacement of the base material, etc. are not required. For example, when the non-flexible display device is to be manufactured, the process of layering including steps S2 to S5 are performed on a glass substrate, after which the process proceeds to step S9.

FIRST EMBODIMENT

Figure 3:
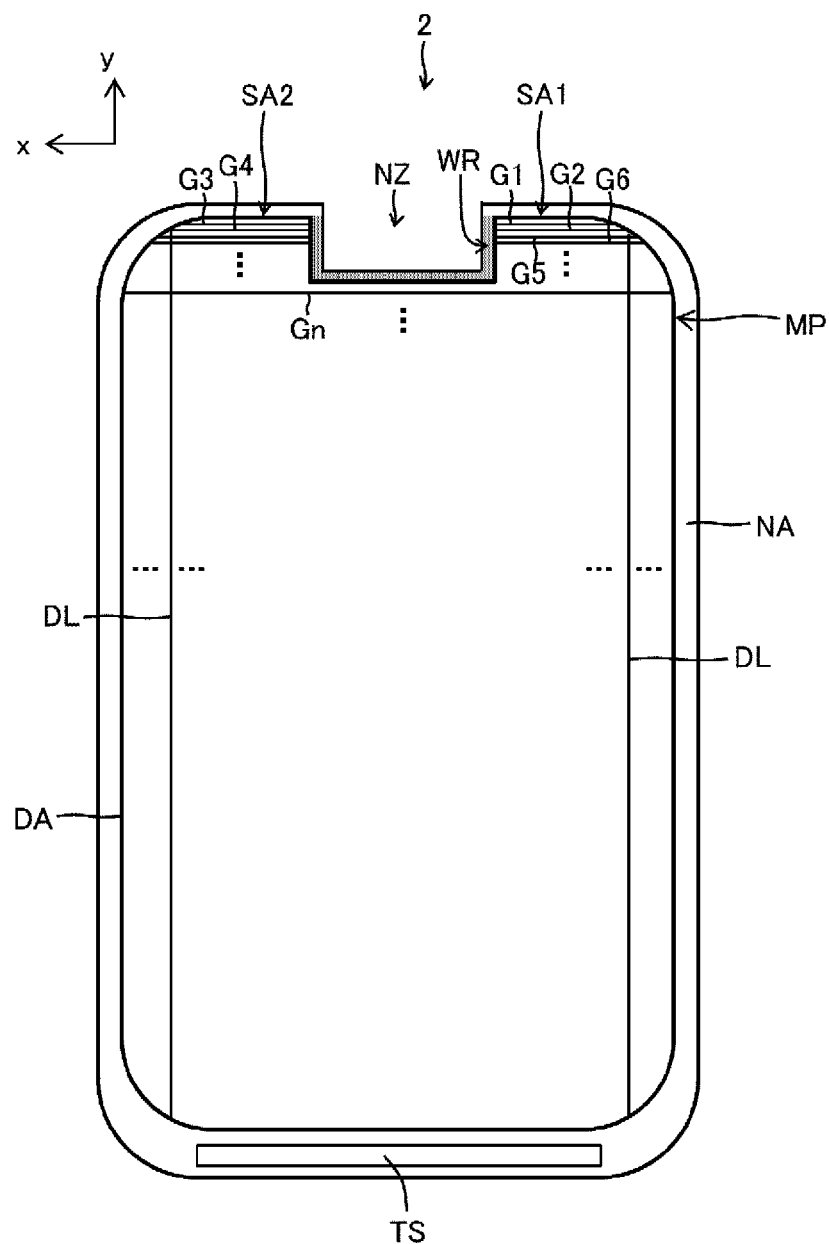
FIG. 3 is a plan view illustrating a display device 2 of a first embodiment.

The display device 2 of a first embodiment will be described with reference to FIG. 3. FIG. 3 is a plan view illustrating the display device 2 of the first embodiment.

The display device 2 includes a display region DA and a frame region (non-display region) NA surrounding the display region DA.

Figure 4:
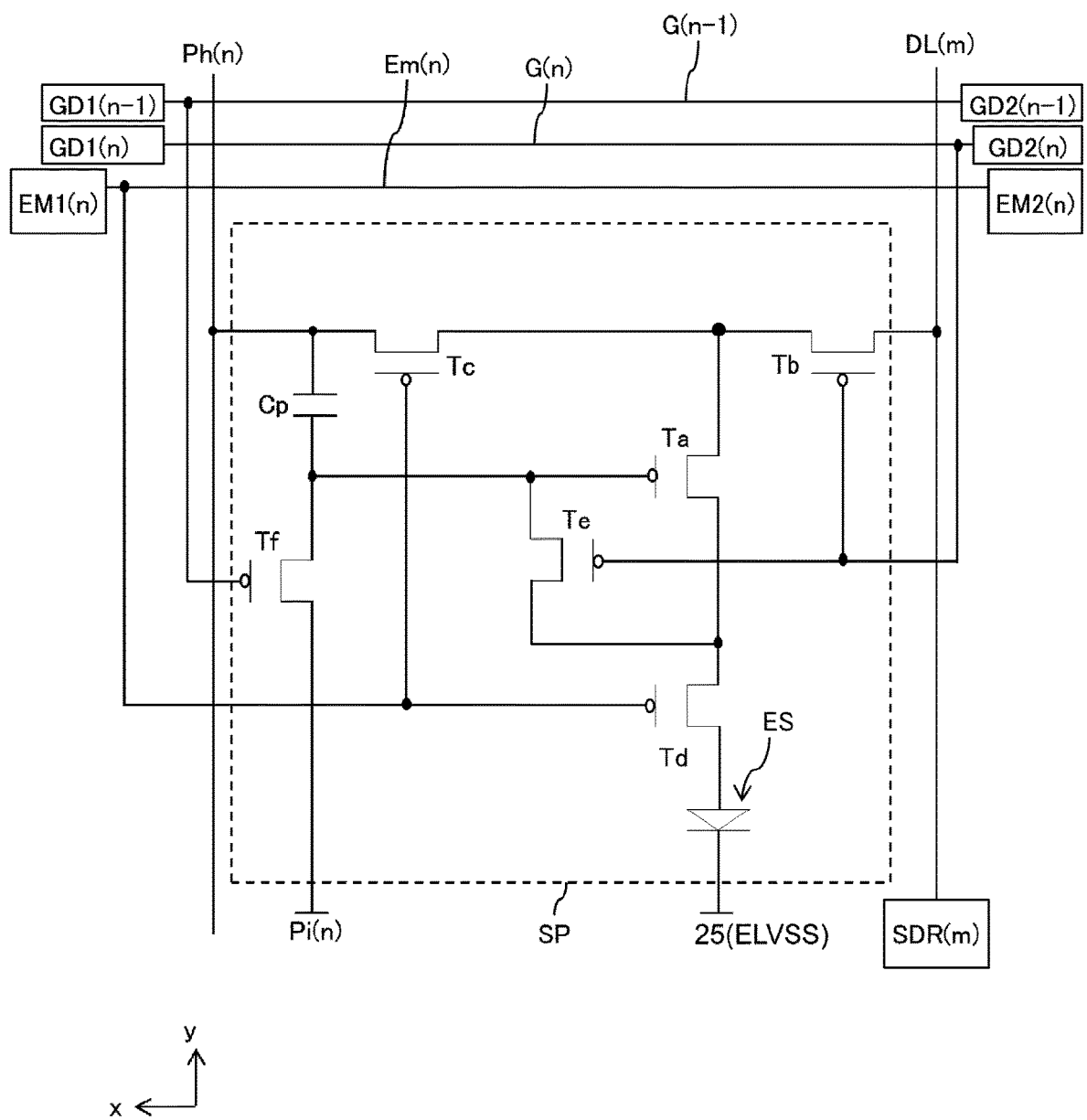
FIG. 4 is a circuit diagram illustrating a configuration example of a subpixel provided in a display region.

As illustrated in FIG. 3, in the display device 2, a notch portion NZ is formed in the display region DA. The display region DA includes a first notch display portion SA1 located on one side (right side in FIG. 3) of the notch portion NZ and a second notch display portion SA2 located on the other side (left side in FIG. 3) of the notch portion NZ. A plurality of subpixels are provided in each of the notch display portions SA1 and SA2. As illustrated in FIG. 4, the subpixel SP is formed by a light-emitting element ES (for example, an OLED) and a subpixel circuit thereof (formed in the TFT layer 4 in FIG. 2).

The display region DA includes a plurality of data signal lines DL (m lines, where m is an integer of one or greater), a plurality of control lines, and a plurality of subpixel circuits. The control lines include a plurality of scanning control lines G (n lines, where n is an integer of one or greater) and a plurality of light emission control lines EM (n lines, where n is an integer of one or greater). n×m subpixel circuits are provided in a matrix shape so that the subpixel circuits correspond to respective intersections of the data signal lines DL and the scanning control lines G.

The plurality of control lines intersect the plurality of data signal lines DL. The plurality of light emission control lines EM intersect the plurality of data signal lines DL.

The subpixel SP is connected to, for example, a data signal line DL(m), a scanning control line G(n), a light emission control line EM(n), a high voltage power source line Ph(n), and an initialization power source line Pi(n). Note that one electrode of a capacitance Cp is connected to the high voltage power source line Ph(n), and the other electrode is connected to a gate terminal of a drive transistor Ta and the initialization power source line Pi(n) via an initialization transistor Tf. The drive transistor Ta includes a gate terminal connected to the scanning control line G(n), a source terminal connected to the data signal line DL(m) via a write transistor Tb, and a drain terminal connected to the anode 22 of the light-emitting element ES via a light emission control transistor Td. The drain terminal of the drive transistor Ta is also connected to a control terminal of the drive transistor Ta via a threshold control transistor Te. The source terminal of the drive transistor Ta is also connected to the high voltage power source line Ph(n) via a power supply transistor Tc. The cathode 25 of the light-emitting element ES is a common electrode formed in common with a plurality of the light-emitting elements ES, and is connected to a low power supply voltage ELVSS.

The data signal line DL(m) is connected to the source driver SDR(m) (drive circuit), the scanning control line G(n) is connected to the gate drivers GD1($n$) and GD2($n$) (drive circuits), the scanning control line G(n−1) is connected to the gate drivers GD1($n$−1) and GD2($n$−1) (drive circuits), and the light emission control line EM(n) is connected to the emission drivers ED1($n$) and ED2($n$) (drive circuits). The gate drivers GD1($n$) and GD2($n$), the gate drivers GD1($n$−1) and GD2($n$−1), and the emission drivers ED1($n$) and ED2($n$) are formed monolithically in the TFT layer 4 included in the frame region (non-display region) NA. The gate drivers GD1($n$) and GD2($n$) are disposed to face each other across the display region DA. The control line may be driven on one side or driven on both sides. However, at least the control lines (in the Example, the light emission control lines EM) that are each divided at the first notch display portion SA1 or the second notch display portion SA2 in the notch portion are driven on one side.

In the following, examples in which the lead wiring lines of adjacent scanning control lines G overlap each other via the inorganic insulating film in the frame region on the periphery of the notch portion will be described. The display device 2 is provided with scanning control lines G1 to G5 and G(n) extending in the x direction and data signal lines DL extending in the y direction. The scanning control lines G1, G2, G5, and G6 are the light emission control lines G that pass through the first notch display portion SA1, sandwich the light emission control line EM therebetween, and are adjacent to each other. The scanning control lines G3 and G4 are the light emission control lines G that pass through the second notch display portion SA2, sandwich the light emission control line EM therebetween, and are adjacent to each other. Note that the control lines being adjacent to each other (for example, the first control line and the second control line are adjacent to each other) means that the light emission control lines G being the same type of control lines are adjacent to each other, and that the light emission control lines EM being the same type of control lines are adjacent to each other. The scanning control lines G pass through a main display portion MP on the inner side (lower side in FIG. 3) of the notch portion NZ.

Figure 5:
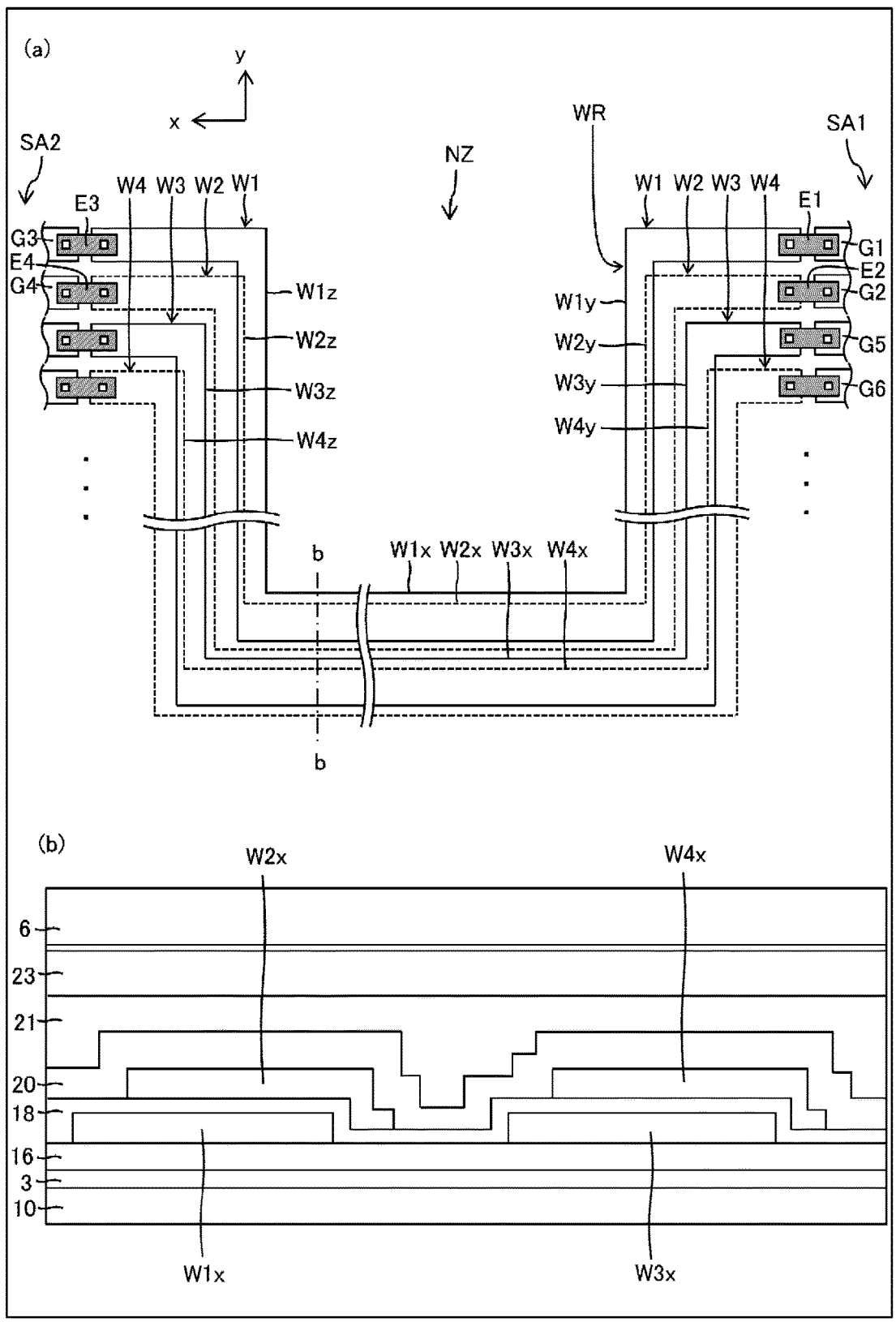
FIG. 5(a) is a plan view of at and near a notch portion.
FIG. 5(b) is a cross-sectional view taken along a line b-b of FIG. 5(a).

As illustrated in FIG. 5, a first lead wiring line W1 electrically connected to the first scanning control line G1 and a second lead wiring line W2 electrically connected to the second scanning control line G2 are provided on a periphery WR of the notch portion NZ (the frame region on the periphery of the notch portion NZ). Hereinafter, the first scanning control line G1, the second scanning control line G2, the first lead wiring line W1, and the second lead wiring line W2 may be respectively abbreviated as a scanning control line G1, a scanning control line G2, a lead wiring line W1, and a lead wiring line W2. Note that in FIG. 5, the third lead wiring line W3 and the fourth lead wiring line W4 respectively correspond to the lead wiring line W1 and the lead wiring line W2.

Each of the lead wiring lines W1 and W2 extends from the display region DA toward the notch portion NZ. The extending direction of the lead wiring line W1 and the extending direction of the lead wiring line W2 are the same.

In the display region DA, the scanning control line G1 and the scanning control line G2 are formed of a first metal layer so as to be adjacent to each other. On the periphery WR of the notch portion NZ (the frame region on the periphery of the notch portion NZ), the lead wiring line W1 is formed of the first metal layer, and the lead wiring line W2 is formed of a second metal layer that is a layer different from the first metal layer.

The lead wiring lines W1 and W2 have a shape that bypasses the notch portion NZ to avoid the notch portion NZ, and the camera lenses, sensors, and the like can be arranged to overlap the notch portion NZ.

As illustrated in FIG. 5, the lead wiring line W1 and the scanning control line G1 are electrically connected via two contact holes and a relay electrode E1. The lead wiring line W2 and the scanning control line G2 are electrically connected via two contact holes and a relay electrode E2. The lead wiring line W1 and the scanning control line G3 are electrically connected via two contact holes and a relay electrode E3. The lead wiring line W2 and the scanning control line G4 are electrically connected via two contact holes and a relay electrode E4. The relay electrodes E1 to E4 are formed in the third metal layer (source layer) in FIG. 2.

The lead wiring line W1 includes bypass portions W1$x$, W1$y$, and W1$z$ located on the periphery WR of the notch portion NZ, the bypass portion W1$x$ extends in the x direction, and the bypass portions W1$y$ and W1$z$ extend in the y direction (a direction orthogonal to the x direction). The lead wiring line W2 includes bypass portions W2$x$, W2$y$, and W2$z$ located on the periphery WR of the notch portion NZ, the bypass portion W2$x$ extends in the x direction, and the bypass portions W2$y$ and W2$z$ extend in the y direction.

In Exemplary Embodiment 1, as illustrated in FIG. 5, the bypass portion W1$x$ and the bypass portion W2$x$ that extend in the x direction overlap each other via the inorganic insulating film 18 in a plan view. The bypass portion W1$y$ and the bypass portion W2$y$ that extend in the y direction overlap each other via the inorganic insulating film 18. The bypass portion W1$z$ and the bypass portion W2$z$ that extend in the y direction overlap each other via the inorganic insulating film 18. Note that "overlap" refers to overlap in a plan view.

Figure 7:
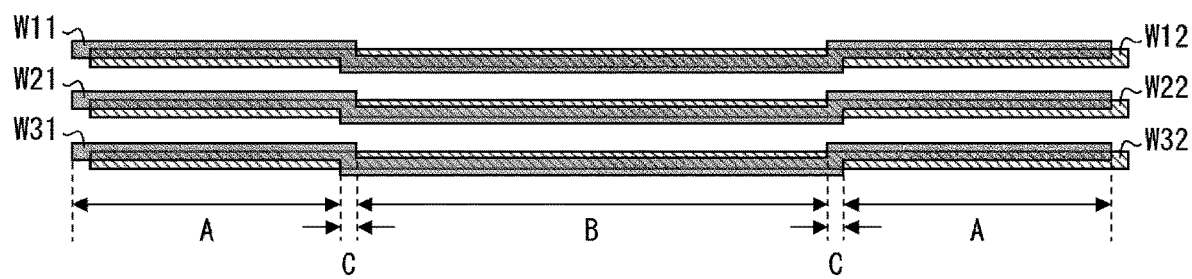
FIG. 7 is a view illustrating an overlap shape of lead wiring lines W1 and W2 in a display device of the first embodiment.

For example, as illustrated in FIG. 7, either one lead wiring line of the lead wiring line W1 and the lead wiring line W2 has a first region A and a second region B described below.

The first region A is a region that overlaps to straddle only an end portion of the lead wiring line on the side opposite to the display region in a direction orthogonal to the extending direction. In other words, in FIG. 7, the first region A is a region where the lead wiring line W11 overlaps on the upper side of the lead wiring line W12 and does not overlap on the lower side in the direction orthogonal to the extending direction of the lead wiring line.

The second region B is a region that overlaps to straddle only an end portion of the lead wiring line on the side opposite to the display region in a direction orthogonal to the extending direction. In other words, in FIG. 7, the second region B is a region where the lead wiring line W11 overlaps on the lower side of the lead wiring line W12 and does not overlap on the upper side in the direction orthogonal to the extending direction of the lead wiring line.

By bending at least one of the lead wiring line W1 and the lead wiring line W2, the lead wiring line W1 and the lead wiring line W2 can overlap each other. In a case where the lead wiring line W1 and the lead wiring line W2 overlap each other, both may be straight lines, or one of them may be a straight line and the other may be bent diagonally.

By providing the first region A and the second region B, the capacitance of the wiring lines can be increased and the amount of load can be increased. By including the first region A and the second region B, when the finish of each wiring line is misaligned from a predetermined position such as misalignment in the vertical direction, a portion misaligned in a direction in which the capacitance of the wiring line increases and a portion misaligned in a direction in which the capacitance of the wiring line decreases are generated. As a result, the misalignment of the wiring line is offset, and thus, the effect of misalignment is reduced. Thus, luminance variation generated by a difference in the bus line loads of the main display portion and the notch display portion can be suppressed.

Figure 6:
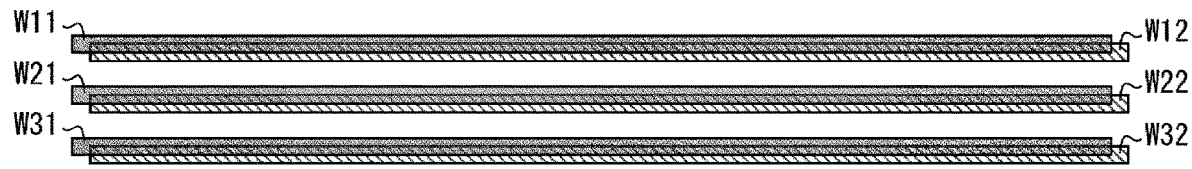
FIG. 6 is a view illustrating an overlap shape of lead wiring lines W1 and W2 in a case where the amount of overlap is uniform.

On the other hand, as illustrated in FIG. 6, in a case where the amount of overlap is uniform, in other words, in a case where the first region A and the second region B are not provided, there is a large effect due to generation of wiring line misalignment, and the luminance variation is generated by the difference in the bus line loads of the main display portion and the notch display portion.

As illustrated in FIG. 7, in the lead wiring line having the first region A and the second region B, the sum of the lengths of the first regions A in the extending direction and the sum of the lengths of the second regions B in the extending direction are preferably the same. For example, when the lead wiring line W2 is misaligned in a downward direction, the capacitance of the wiring lines in the first region A is reduced. On the other hand, the capacitance of the wiring lines in the second region B is increased, so that the effect of the misalignment of the lead wiring line W2 is offset. As a result, luminance variation can be suppressed.

In FIG. 7, the first region A and the second region B are aligned in the order of the first region A, the second region B, and the first region A in the extending direction of the lead wiring lines, but may be aligned in the order of the second region B, the first region A, and the second region B in the extending direction of the lead wiring line.

In FIG. 7, both ends of the overlap region are first regions A in the extending direction of the lead wiring line, but both ends of the overlap region may be second regions B. As illustrated in FIG. 7, by configuring the disposition of the first region A and the second region B to be left-right symmetrical, the coupling to the relay electrodes and the signal lines is also designed to be left-right symmetrical, making the design easy.

A third region C that overlaps at an upper portion and also overlaps at a lower portion in a direction orthogonal to the extending direction of the lead wiring line may be included between the first region A and the second region B.

The lead wiring line W1 and the lead wiring line W2 may be the same in width or different in width, but are preferably the same in width as illustrated in FIG. 7. The materials of the lead wiring line W1 and the lead wiring line W2 may be the same or different from each other, but are preferably the same. Examples of the material of the lead wiring lines include GE, M3, and the like.

In FIG. 7, the bending points (intersection points) of the lead wiring lines W1 and W2 are two, but the number of bending points may be selected as appropriate. In the present specification, each bending point indicates the boundary between the first region A and the second region B. From the perspective of ease of design and ease of wiring operation, both ends of the overlap region are preferably the same region. Thus, the number of bending points is preferably an even number. The bending points may be disposed in a zig-zag shape as the entire lead wiring line.

MODIFICATION EXAMPLE 1

Figure 8:
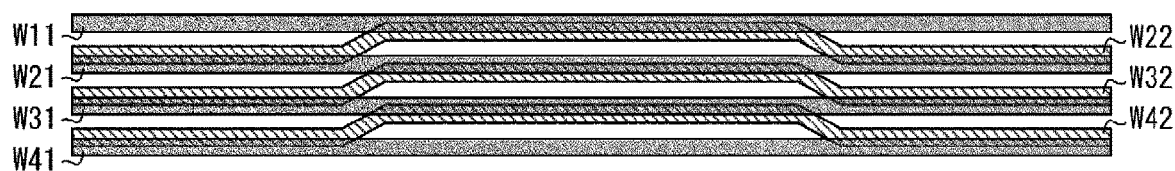
FIG. 8 is a view illustrating an overlap shape of lead wiring lines W1 and W2 in a display device of a modification example of the first embodiment of the disclosure.

As illustrated in FIG. 8, the overlap shape of the first lead wiring line and the second lead wiring line of the display device differs from the overlap shape illustrated in FIG. 7, in that the lead wiring line W32 overlaps the lead wiring line W21 that overlaps to straddle only an end portion of the lead wiring line W32 on the side opposite to the display region and the lead wiring line W31 that straddles only an end portion of the lead wiring line W32 on the side closer to the display region. In other words, in a case where the lead wiring line having the first region A and the second region B is the lead wiring line W32, the lead wiring line W21 that overlaps to straddle only the end portion on the side opposite to the display region and the lead wiring line W31 that straddles only the end portion on the side closer to the display region may be adjacent to each other.

The lead wiring line W31 may overlap the lead wiring line W22 that overlaps to straddle only an end portion of the lead wiring line W31 on the side opposite to the display region and the lead wiring line W32 that straddles only an end portion on the side closer to the display region. In other words, in a case where the lead wiring line having the first region A and the second region B is the lead wiring line W31, the lead wiring line W22 that overlaps to straddle only the end portion on the side opposite to the display region and the lead wiring line W32 that straddles only the end portion on the side closer to the display region may be adjacent to each other.

MODIFICATION EXAMPLE 2

As a modification example of the display device of the first embodiment illustrated in FIG. 7, the display region includes a main display portion, a first notch display portion, and a second notch display portion, the first notch display portion and the second notch display portion sandwiching the notch portion, the frame region adjacent to a bottom face of the notch portion sandwiched by the first notch display portion and the second notch display portion includes a plurality of first lead wiring lines and second lead wiring lines that overlap each other, and a sum of overlap areas of a first region A and a second region B of a first lead wiring line and a second lead wiring line that are closest to the main display portion and overlap each other may be adjusted, so that the luminance unevenness is not visible at the boundary between the notch display portion and the main display portion.

In other words, luminance variation can be suppressed by controlling the amount of load in at and near the boundary between the main display portion and the notch display portion.

SECOND EMBODIMENT

Next, a display device of a second embodiment of the disclosure will be described with reference to FIG. 9 and FIG. 10. Note that in the following description of each of the embodiments, the contents described above will not be described and will be described mainly about the differences.

Figure 9:
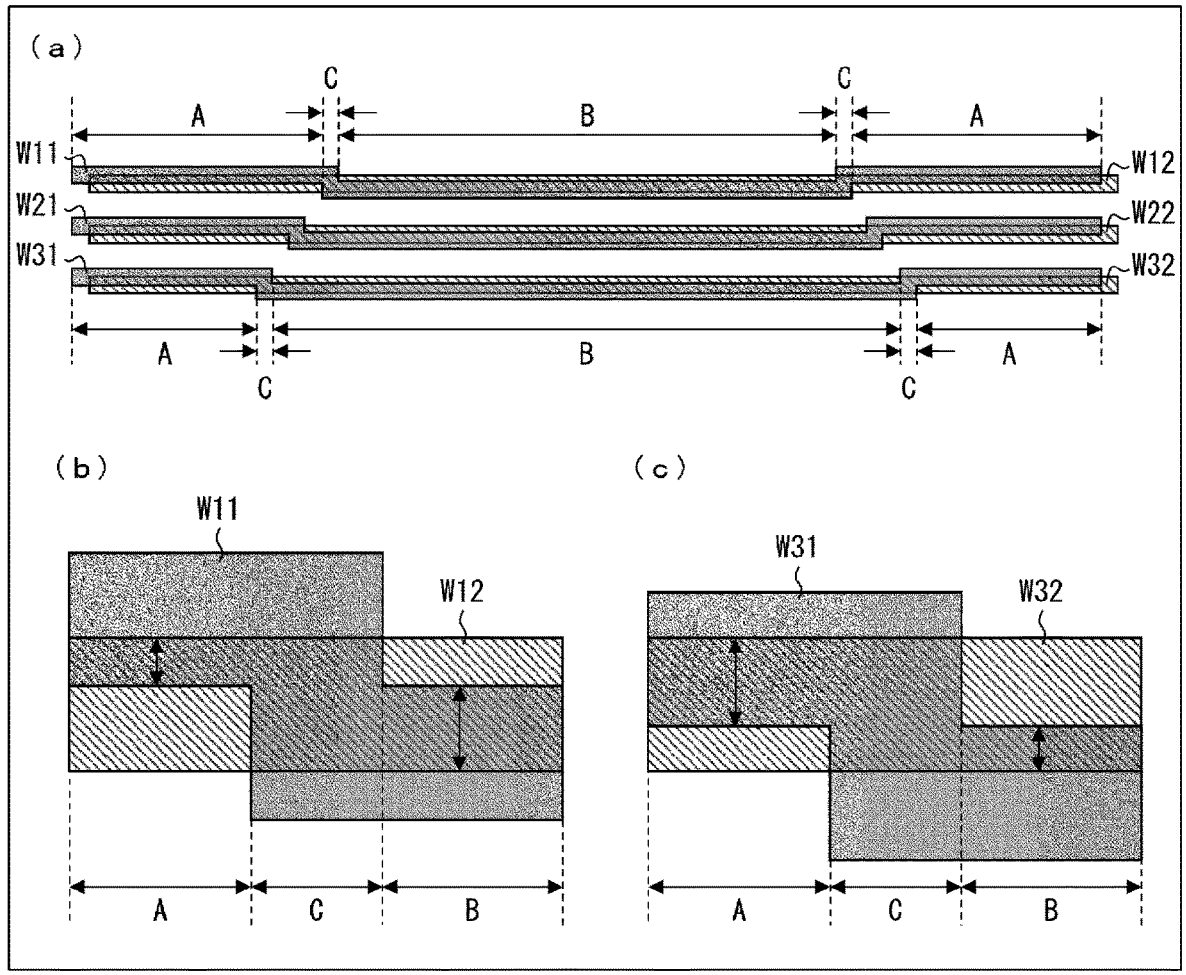
FIG. 9(a) is a view illustrating each of overlap shapes of lead wiring lines W11 and W12, lead wiring lines W21 and W22, and lead wiring lines W31 and W32 in a display device of a second embodiment.
FIG. 9(b) is an enlarged view of the overlap shape of the lead wiring lines W11 and W12.
FIG. 9(c) is an enlarged view of the overlap shape of the lead wiring lines W31 and W32.
Figure 10:
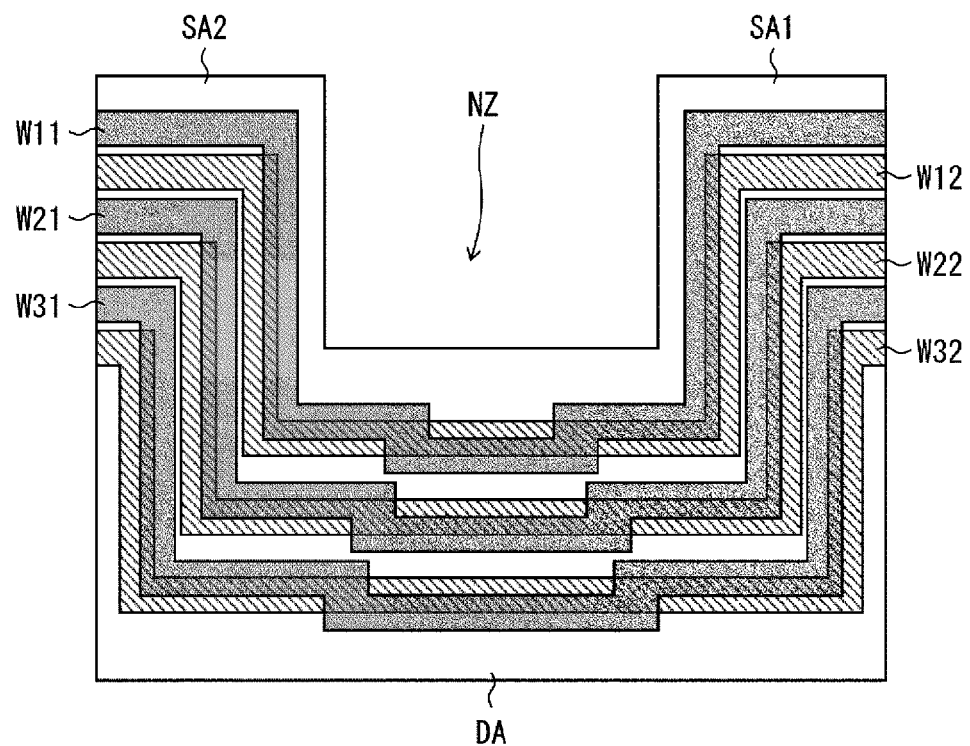
FIG. 10 is a plan view illustrating a part of a display device of the second embodiment.

FIG. 9 and FIG. 10 are views illustrating overlap shapes of the first lead wiring lines and the second lead wiring lines in the display device of the second embodiment of the disclosure.

The display device of the second embodiment differs from the display device illustrated in FIG. 7 in the overlap shapes of the first lead wiring lines and the second lead wiring lines in the following points.

As illustrated in (a) of FIG. 9, a first lead wiring line on the side closer to the display region out of the first lead wiring lines is referred to as a lower first lead wiring line W21. A first lead wiring line on the side opposite to the display region and adjacent to the lower first lead wiring line W21 is referred to as an upper first lead wiring line W11. A second lead wiring line that overlaps the lower first lead wiring line is referred to as a lower second lead wiring line W22. A second lead wiring line on the side opposite to the display region and adjacent to the lower second lead wiring line W22 is referred to as an upper second lead wiring line W12. In this case, a second region B of the upper first lead wiring line W11 and the upper second lead wiring line W12 and a second region B of the lower first lead wiring line W21 and the lower second lead wiring line W22 have different lengths. This configuration is effective when, for example, a wiring line pitch is narrow and securing a space between the wiring lines is desired.

As illustrated in FIG. 9 and FIG. 10, a first region A of the upper first lead wiring line W11 and the upper second lead wiring line W12 and a first region A of the lower first lead wiring line W21 and the lower second lead wiring line W22 may also have different lengths. This configuration is effective when, for example, a wiring line pitch is narrow and securing a space between the wiring lines is desired.

As described above, when the length of the first region A or the second region B is different, the amount of overlap is different. As illustrated in FIG. 9, the amount of overlap of the first region A of the upper first lead wiring line W11 and the upper second lead wiring line W12 is smaller than the amount of overlap of the first region A of the lower first lead wiring line W21 and the lower second lead wiring line W22. On the other hand, the amount of overlap of the second region B is large. According to this configuration, the impact can be minimized when the misalignment of the wiring lines is generated.

The region where the second region B of the upper first lead wiring line W11 and the upper second lead wiring line W12 and the second region B of the lower first lead wiring line W21 and the lower second lead wiring line W22 have different lengths may be only the frame region of the notch portion adjacent to the main display portion. According to this configuration, the length of the lead wiring line is longer than the length in the frame region of the first notch display portion or the second notch display portion, and the degree of freedom of the design increases. The region where the first region A of the upper first lead wiring line W11 and the upper second lead wiring line W12 and the first region A of the lower first lead wiring line W21 and the lower second lead wiring line W22 have different lengths may also be only the frame region of the notch portion adjacent to the main display portion.

The frame region of the notch portion adjacent to the main display portion may include the upper first lead wiring line W11, the upper second lead wiring line W12, the lower first lead wiring line W21, and the lower second lead wiring line W22.

In a first lead wiring line closest to the display region out of the first lead wiring lines, the first region A and the second region B of a second lead wiring line with which the first lead wiring line overlaps preferably have the same length. According to this configuration, luminance variation between the main display portion and the notch display portion can be suppressed.

The length of the first region A and/or the second region B may be longer or shorter from the main display portion toward the notch display portion.

THIRD EMBODIMENT

Next, a display device of a third embodiment of the disclosure will be described with reference to FIG. 11. Note that in the following description of each of the embodiments, the contents described above will not be described and will be described mainly about the differences.

Figure 11:
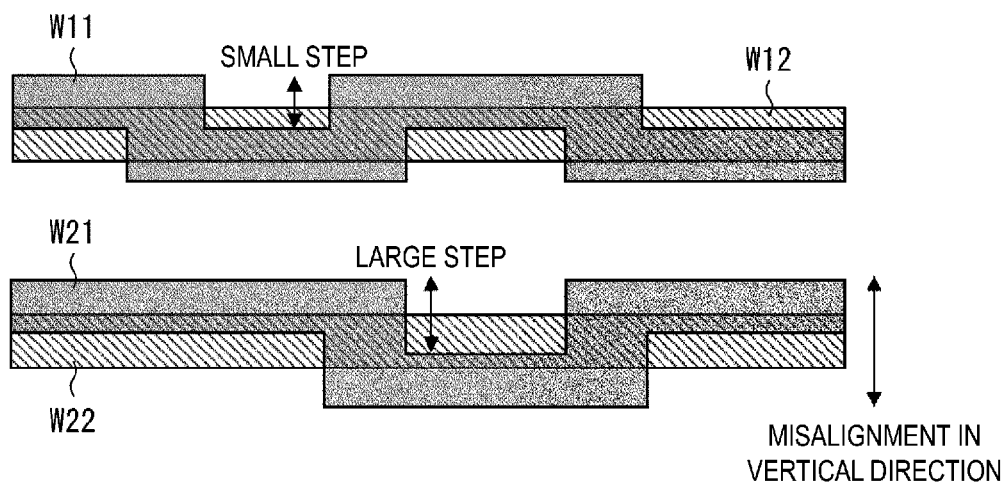
FIG. 11 is a view illustrating each of overlap shapes of lead wiring lines W11 and W12 and lead wiring lines W21 and W22 in a display device of a third embodiment.

FIG. 11 is a view illustrating an overlap shape of a first lead wiring line and a second lead wiring line in the display device of the third embodiment of the disclosure.

The display device of the third embodiment differs from the display device illustrated in FIG. 7 in the overlap shape of the first lead wiring line and the second lead wiring line with respect to the following points.

The display region includes a main display portion, a first notch display portion, and a second notch display portion, the first notch display portion and the second notch display portion sandwiching the notch portion, and the frame region of a notch portion adjacent to the main display portion includes a plurality of first lead wiring lines and second lead wiring lines that overlap each other.

The first lead wiring line on the side closer to the display region out of the above-described plurality of first lead wiring lines is referred to as a lower first lead wiring line W21. A first lead wiring line on the side opposite to the display region and adjacent to the above described lower first lead wiring line W21 is referred to as an upper first lead wiring line W11. A second lead wiring line that overlaps the above described lower first lead wiring line W21 is referred to as a lower second lead wiring line W22. A second lead wiring line on the side opposite to the display region and adjacent to the above described lower second lead wiring line W22 is referred to as an upper second lead wiring line W12.

In this case, the second region B of the upper first lead wiring line W11 that overlaps the upper second lead wiring line W12 and the second region B of the lower first lead wiring line W21 that overlaps the lower second lead wiring line W22 have different overlap widths in a direction orthogonal to the extending direction of the lead wiring lines in a plan view.

As illustrated in FIG. 11, the amount of overlap of the upper first lead wiring line W11 and the upper second lead wiring line W12 on the side closer to the notch display portion having fewer subpixels, is configured to be greater than the amount of overlap of the lower first lead wiring line W21 and the lower second lead wiring line W22 on the side closer to the display region. By increasing the amount of overlap of at least one of the horizontal direction and the vertical direction, the capacitance can be increased. According to this configuration, a difference in the amount of loads generated between the notch display portion having a small number of subpixels and the display region having a large number of subpixels can be reduced, and luminance variation can be suppressed.

The width or area where the upper first lead wiring line W11 overlaps the upper second lead wiring line W12 in the second region B may be smaller than the width or area where the lower first lead wiring line W21 overlaps the lower second lead wiring line W22 in the second region B.

A width of at least one of the first region A and the second region B in a direction orthogonal to the extending direction of the lead wiring line may be determined according to the number of subpixels electrically connected to the lead wiring lines. As the number of the subpixels to be connected increases, the overlap width may be reduced.

MODIFICATION EXAMPLE 1

As a modification example of the display device of the third embodiment illustrated in FIG. 11, a display region includes a main display portion, a first notch display portion, and a second notch display portion, the first notch display portion and the second notch display portion sandwiching the notch portion, in a frame region of the notch portion adjacent to the first notch display portion, either one lead wiring line of the first lead wiring line and the second lead wiring line may have only the first region A, and in the frame region of the notch portion adjacent to the second notch display portion, either one lead wiring line of the first lead wiring line and the second lead wiring line may have only the first region A.

According to the above described configuration, the overlap area can be maintained not only when the wiring line is misaligned in the vertical direction, but also when the wiring line is misaligned in the horizontal direction. In the examples described above, the examples in which the lead wiring lines of adjacent light emission control lines G overlap each other via the inorganic insulating film in the frame region on the periphery of the notch portion have been described. Alternatively, the lead wiring lines of adjacent light emission control lines EM may overlap each other via the inorganic insulating film in the frame region on the periphery of the notch portion. In this case, the control lines that are each divided at the first notch display portion SA1 or the second notch display portion SA2 in the notch portion are the light emission control lines G and are driven on one side.

Supplement

A display device according to a first aspect of the disclosure includes:
  a display region formed with a notch portion; and
  a frame region surrounding the display region,
    wherein the display region includes
    a plurality of data signal lines,
    a plurality of control lines including a plurality of scanning control lines intersecting the plurality of data signal lines and a plurality of light emission control lines intersecting the plurality of data signal lines, and a plurality of subpixel circuits corresponding to respective intersection points of the plurality of data signal lines and the plurality of scanning control lines, a frame region on a periphery of the notch portion out of the frame region includes a first lead wiring line electrically connected to a first control line and extending from the display region toward the notch portion, the first control line being one of the plurality of control lines, and a second lead wiring line electrically connected to a second control line and extending from the display region toward the notch portion, the second control line being adjacent to the first control line, in the display region, the first control line and the second control line are formed of a first metal layer, in the frame region on the periphery of the notch portion, the first lead wiring line is formed of the first metal layer, and the second lead wiring line is formed of a second metal layer, the second metal layer being a different layer from the first metal layer, in a plan view, an extending direction of the first lead wiring line and an extending direction of the second lead wiring line are same, the first lead wiring line and the second lead wiring line overlap each other via an inorganic insulating film, and either one lead wiring line of the first lead wiring line and the second lead wiring line includes a first region overlapping to straddle only an end portion of another lead wiring line of the first lead wiring line and the second lead wiring line on a side opposite to the display region in a direction orthogonal to the extending direction of the other lead wiring line and a second region overlapping to straddle only an end portion of the other lead wiring line on a side closer to the display region in the direction orthogonal to the extending direction the other lead wiring line.

In a display device according to a second aspect of the disclosure, the first control line and the second control line are the plurality of scanning control lines.

In a display device according to a third aspect of the disclosure, the first control line and the second control line are the plurality of light emission control lines.

In a display device according to a fourth aspect of the disclosure, the first lead wiring line and the second lead wiring line are same in width.

In a display device according to a fifth aspect of the disclosure, the either one lead wiring line of the first lead wiring line and the second lead wiring line is the first lead wiring line, and a second lead wiring line overlapped with the first lead wiring line straddling only the end portion on the side opposite to the display region and a second lead wiring line overlapped with the first lead wiring line straddling only the end portion on the side closer to the display region are adjacent to each other.

In a display device according to a sixth aspect of the disclosure, the either one lead wiring line of the first lead wiring line and the second lead wiring line is the second lead wiring line, and a first lead wiring line overlapped with the second lead wiring line straddling only the end portion on the side opposite to the display region and a first lead wiring line overlapped with the second lead wiring line straddling only the end portion on the side closer to the display region are adjacent to each other.

In a display device according to a seventh aspect of the disclosure, in the either one lead wiring line of the first lead wiring line and the second lead wiring line, a sum of a length of the first region in the extending direction and a sum of a length of the second region in the extending direction are same.

In a display device according to an eighth aspect of the disclosure, the first region and the second region are arranged in an order of the first region, the second region, and the first region, or in an order of the second region, the first region, and the second region, in the extending direction of the lead wiring line.

In a display device according to a ninth aspect of the disclosure, both ends of an overlap region are both the first region or both the second region in the extending direction of at least one of the lead wiring lines.

A display device according to a tenth aspect of the disclosure includes a third region between the first region and the second region, the third region involves overlapping at an upper portion of the lead wiring line and overlapping at a lower portion of the lead wiring line in a direction orthogonal to the extending direction.

In a display device according to an eleventh aspect of the disclosure, out of the first lead wiring line, a first lead wiring line on the side closer to the display region is configured to be a lower first lead wiring line, and a first lead wiring line adjacent to the lower first lead wiring line and on the side opposite to the display region is configured to be an upper first lead wiring line, a second lead wiring line overlapping the lower first lead wiring line is configured to be a lower second lead wiring line, a second lead wiring line adjacent to the lower second lead wiring line and on the side opposite to the display region is configured to be an upper second lead wiring line, and a second region of the upper first lead wiring line and the upper second lead wiring line and a second region of the lower first lead wiring line and the lower second lead wiring line are different in length from each other.

In a display device according to a twelfth aspect of the disclosure, out of the first lead wiring line, a first lead wiring line on the side closer to the display region is configured to be a lower first lead wiring line, and a first lead wiring line adjacent to the lower first lead wiring line and on the side opposite to the display region is configured to be an upper first lead wiring line, a second lead wiring line overlapping the lower first lead wiring line is configured to be a lower second lead wiring line, a second lead wiring line adjacent to the lower second lead wiring line and on the side opposite to the display region is configured to be an upper second lead wiring line, and a first region of the upper first lead wiring line and the upper second lead wiring line and a first region of the lower first lead wiring line and the lower second lead wiring line are different in length from each other.

A display device according to a thirteenth aspect of the disclosure, the display region includes a main display portion, a first notch display portion, and a second notch display portion, the first notch display portion and the second notch display portion sandwiching the notch portion, and a frame region of the notch portion adjacent to the main display portion includes the lower first lead wiring line, the upper first lead wiring line, the lower second lead wiring line, and the upper second lead wiring line.

In a display device according to a fourteenth aspect of the disclosure, in a first lead wiring line closest to the display region out of the first lead wiring line, the first region and the second region of the second lead wiring line overlapped with the first lead wiring line are same in length.

In a display device according to a fifteenth aspect of the disclosure, a length of the second region of the second lead wiring line increases or decreases from the display region toward the notch portion.

In a display device according to a sixteenth aspect of the disclosure, a length of the first region of the second lead wiring line increases or decreases from the display region toward the notch portion.

In a display device according to a seventeenth aspect of the disclosure, the display region includes a main display portion, a first notch display portion, and a second notch display portion, the first notch display portion and the second notch display portion sandwiching the notch portion, a frame region of a notch portion adjacent to the main display portion includes a plurality of first lead wiring lines and a plurality of second lead wiring lines overlapping each other, out of the plurality of first lead wiring lines, a first lead wiring line on the side closer to the display region is configured to be a lower first lead wiring line, and a first lead wiring line adjacent to the lower first lead wiring line and on the side opposite to the display region is configured to be an upper first lead wiring line, a second lead wiring line overlapping the lower first lead wiring line is configured to be a lower second lead wiring line, a second lead wiring line adjacent to the lower second lead wiring line and on the side opposite to the display region is configured to be an upper second lead wiring line, and in a plan view, a second region of the upper first lead wiring line overlapping the upper second lead wiring line and a second region of the lower first lead wiring line overlapping the lower second lead wiring line are different in overlap width from each other in a direction orthogonal to the extending direction of the lead wiring lines.

In a display device according to an eighteenth aspect of the disclosure, a width where the upper first lead wiring line overlaps the upper second lead wiring line in the second region is smaller than a width where the lower first lead wiring line overlaps the lower second lead wiring line in the second region.

In a display device according to a nineteenth aspect of the disclosure, an area where the upper first lead wiring line overlaps the upper second lead wiring line in the second region is smaller than an area where the lower first lead wiring line overlaps the lower second lead wiring line in the second region.

In a display device according to a twentieth aspect of the disclosure, a width of at least one of the first region and the second region in the direction orthogonal to the extending direction of the lead wiring lines is determined according to the number of subpixels electrically connected to the lead wiring lines.

In a display device according to a twenty-first aspect of the disclosure, as the number of the subpixels to be connected increases, the overlap width decreases.

In a display device according to a twenty-second aspect of the disclosure, the display region includes a main display portion, a first notch display portion, and a second notch display portion, the first notch display portion and the second notch display portion sandwiching the notch portion, in a frame region of the notch portion adjacent to the first notch display portion, either one lead wiring line of the first lead wiring line and the second lead wiring line includes only the first region, and in a frame region of the notch portion adjacent to the second notch display portion, either one lead wiring line of the first lead wiring line and the second lead wiring line includes only the first region.

Note that the display device related to the disclosure may be provided with a display panel having flexibility and a bendable display element. The above-mentioned display element includes a display element having luminance or a transmittance controlled by current and a display element having luminance or a transmittance controlled by voltage.

For example, the display device according to the disclosure may include an Organic Light Emitting Diode (OLED) as a current-controlled display element. In this case, the display device according to the present embodiment may be an Electro Luminescent (EL) display.

Alternatively, the display device according to the disclosure may include an inorganic light emitting diode as a current-controlled display element. In this case, the display device according to the present embodiment may be a Quantum dot Light Emitting Diode (QLED) display provided with an EL display QLED such as an inorganic EL display.

Examples of a voltage-controlled display element include a liquid crystal display element and the like.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in the embodiments.

The invention claimed is:

1. A display device comprising:
a display region formed with a notch portion; and
a frame region surrounding the display region,
wherein the display region includes
a plurality of data signal lines,
a plurality of control lines including a plurality of scanning control lines intersecting the plurality of data signal lines and a plurality of light emission control lines intersecting the plurality of data signal lines, and
a plurality of subpixel circuits corresponding to respective intersection points of the plurality of data signal lines and the plurality of scanning control lines,
a first frame region on a periphery of the notch portion out of the frame region includes
a first lead wiring line electrically connected to a first control line and extending from the display region toward the notch portion, the first control line being one of the plurality of control lines, and
a second lead wiring line electrically connected to a second control line and extending from the display region toward the notch portion, the second control line being adjacent to the first control line,
in the display region, the first control line and the second control line are formed of a first metal layer,
in the first frame region on the periphery of the notch portion, the first lead wiring line is formed of the first metal layer, and the second lead wiring line is formed of a second metal layer, the second metal layer being a different layer from the first metal layer, in a plan view, an extending direction of the first lead wiring line and an extending direction of the second lead wiring line are same, the first lead wiring line and the second lead wiring line overlap each other via an inorganic insulating film, and either one of the first lead wiring line and the second lead wiring line includes
- a first region overlapping to straddle only an end portion of another one of the first lead wiring line and the second lead wiring line on a side opposite the display region in a direction orthogonal to the extending direction of the other lead wiring line, and
- a second region overlapping to straddle only an end portion of the lead wiring line on a side closer to the display region in the direction orthogonal to the extending direction of the other lead wiring line.

2. The display device according to claim 1, wherein the first control line and the second control line are the plurality of scanning control lines.

3. The display device according to claim 1, wherein the first control line and the second control line are the plurality of light emission control lines.

4. The display device according to claim 1, wherein the first lead wiring line and the second lead wiring line are the same in width.

5. The display device according to claim 1, wherein the either one of the first lead wiring line and the second lead wiring line is the first lead wiring line, and the second lead wiring line overlapped with the first lead wiring line straddling only the end portion on the side opposite the display region and the second lead wiring line overlapped with the first lead wiring line straddling only the end portion on the side closer to the display region are adjacent to each other.

6. The display device according to claim 1, wherein the either one of the first lead wiring line and the second lead wiring line is the second lead wiring line, and the first lead wiring line overlapped with the second lead wiring line straddling only the end portion on the side opposite the display region and the first lead wiring line overlapped with the second lead wiring line straddling only the end portion on the side closer to the display region are adjacent to each other.

7. The display device according to claim 1, wherein in the either one of the first lead wiring line and the second lead wiring line, a sum of a length of the first region in the extending direction and a sum of a length of the second region in the extending direction are same.

8. The display device according to claim 1, wherein the first region and the second region are arranged in an order of the first region, the second region, and the first region, or in an order of the second region, the first region, and the second region, in the extending direction of the lead wiring line.

9. The display device according to claim 1, wherein both ends of an overlap region are both the first region or both the second region in the extending direction of at least one of the lead wiring lines.

10. The display device according to claim 1, further comprising:
- a third region between the first region and the second region, the third region overlapping at an upper portion of the lead wiring line and overlapping at a lower portion of the lead wiring line in a direction orthogonal to the extending direction.

11. The display device according to claim 1, wherein out of the first lead wiring line,
- a first lead wiring line on the side closer to the display region is configured to be a lower first lead wiring line, and
- a first lead wiring line adjacent to the lower first lead wiring line and on the side opposite the display region is configured to be an upper first lead wiring line,
- a second lead wiring line overlapping the lower first lead wiring line is configured to be a lower second lead wiring line,
- a second lead wiring line adjacent to the lower second lead wiring line and on the side opposite the display region is configured to be an upper second lead wiring line, and
- a second region of the upper first lead wiring line and the upper second lead wiring line and a second region of the lower first lead wiring line and the lower second lead wiring line are different in length from each other.

12. The display device according to claim 11, wherein the display region includes a main display portion, a first notch display portion, and a second notch display portion, the first notch display portion and the second notch display portion sandwiching the notch portion, and a second frame region adjacent to the main display portion out of the first frame region includes the lower first lead wiring line, the upper first lead wiring line, the lower second lead wiring line, and the upper second lead wiring line.

13. The display device according to claim 11, wherein in a first lead wiring line closest to the display region out of the first lead wiring line, the first region and the second region of the second lead wiring line overlapped with the first lead wiring line are same in length.

14. The display device according to claim 13, wherein a length of the second region of the second lead wiring line increases or decreases from the display region toward the notch portion.

15. The display device according to claim 1, wherein the display region includes a main display portion, a first notch display portion, and a second notch display portion, the first notch display portion and the second notch display portion sandwiching the notch portion, a second frame region adjacent to the main display portion out of the first frame region includes a plurality of first lead wiring lines and a plurality of second lead wiring lines overlapping each other, out of the plurality of first lead wiring lines,
- a first lead wiring line on the side closer to the display region is configured to be a lower first lead wiring line, and
- a first lead wiring line adjacent to the lower first lead wiring line and on the side opposite the display region is configured to be an upper first lead wiring line,
- a second lead wiring line overlapping the lower first lead wiring line is configured to be a lower second lead wiring line,
- a second lead wiring line adjacent to the lower second lead wiring line and on the side opposite the display region is configured to be an upper second lead wiring line, and in a plan view, a second region of the upper first lead wiring line overlapping the upper second lead wiring line and a second region of the lower first lead wiring line overlapping the lower second lead wiring line are different in overlap width from each other in a direction orthogonal to the extending direction of the lead wiring lines.

16. The display device according to claim 15, wherein a width where the upper first lead wiring line overlaps the upper second lead wiring line in the second region is smaller than a width where the lower first lead wiring line overlaps the lower second lead wiring line in the second region.

17. The display device according to claim 15, wherein an area where the upper first lead wiring line overlaps the upper second lead wiring line in the second region is smaller than an area where the lower first lead wiring line overlaps the lower second lead wiring line in the second region.

18. The display device according to claim 15, wherein a width of at least one of the first region and the second region in the direction orthogonal to the extending direction of the lead wiring lines is determined according to a number of subpixels electrically connected to the lead wiring lines.

19. The display device according to claim 18, wherein as the number of the subpixels to be connected increases, the overlap width decreases.

20. The display device according to claim 15, wherein
in a third frame region adjacent to the first notch display portion out of the first frame region, the either one of the first lead wiring line and the second lead wiring line includes only the first region, and
in a fourth frame region adjacent to the second notch display portion out of the first frame region, the either one of the first lead wiring line and the second lead wiring line includes only the first region.

* * * * *